US012616065B2

(12) United States Patent
Lee et al.

(10) Patent No.: US 12,616,065 B2
(45) Date of Patent: Apr. 28, 2026

(54) SEMICONDUCTOR PACKAGE WITH INTERPOSER INCLUDING RECESS

(71) Applicant: SAMSUNG ELECTRONICS CO., LTD., Suwon-si (KR)

(72) Inventors: Eunsu Lee, Suwon-si (KR); Jangwoo Lee, Suwon-si (KR); Doyoung Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 656 days.

(21) Appl. No.: 18/091,072

(22) Filed: Dec. 29, 2022

(65) Prior Publication Data

US 2023/0352460 A1　Nov. 2, 2023

(30) Foreign Application Priority Data

May 2, 2022　(KR) ......................... 10-2022-0054187

(51) Int. Cl.
　　*H01L 25/00*　　　(2006.01)
　　*H01L 23/00*　　　(2006.01)
　　　　　　(Continued)

(52) U.S. Cl.
　　CPC ........ *H01L 25/105* (2013.01); *H01L 23/3128* (2013.01); *H01L 23/49811* (2013.01); *H01L 23/49822* (2013.01); *H01L 23/49838* (2013.01); *H01L 23/5383* (2013.01); *H01L 23/5389* (2013.01); *H01L 24/13* (2013.01); *H01L 24/16* (2013.01); *H01L 24/81* (2013.01); *H01L 2224/13111* (2013.01); *H01L 2224/13113* (2013.01); *H01L 2224/13116*

(2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01);

(Continued)

(58) Field of Classification Search
None
See application file for complete search history.

(56) References Cited

U.S. PATENT DOCUMENTS 5,219,117 A * 6/1993 Lin ......................... H01L 24/13
　　　　　　　　　　　　　　　　228/253
6,573,610 B1　6/2003 Tsai
(Continued)

FOREIGN PATENT DOCUMENTS

JP　　　　H11121913 A　　4/1999
KR　　　　101185454 B1　　10/2012
(Continued)

*Primary Examiner* — Nicholas J Tobergte
(74) *Attorney, Agent, or Firm* — Sughrue Mion, PLLC

(57) ABSTRACT

A semiconductor package includes a first package substrate, a first semiconductor chip provided on the first package substrate, an interposer provided on the first semiconductor chip, and a vertical conductive structure provided on the first package substrate and a side surface of the first semiconductor chip, and connecting the first package substrate and the interposer, the interposer includes a first recess vertically overlapping the first semiconductor chip in a lower portion of the interposer, and a lower surface of the interposer defining the first recess is higher than an upper surface of the vertical conductive structure.

20 Claims, 14 Drawing Sheets

(51) Int. Cl.

| | | |
|---|---|---|
| *H01L 23/31* | (2006.01) | |
| *H01L 23/498* | (2006.01) | |
| *H01L 23/538* | (2006.01) | |
| *H01L 25/10* | (2006.01) | |

(52) U.S. Cl.
CPC .............. *H01L 2224/81385* (2013.01); *H01L 2224/81447* (2013.01)

(56) References Cited

U.S. PATENT DOCUMENTS

| | | |
|---|---|---|
| 6,608,388 B2 | 8/2003 | Lin et al. |
| 6,686,664 B2 | 2/2004 | Caletka et al. |
| 8,877,554 B2 | 11/2014 | Tsai et al. |
| 8,952,529 B2 | 2/2015 | Lee et al. |
| 2015/0084170 A1* | 3/2015 | Im ........................ H01L 23/3677 438/107 |
| 2016/0171273 A1* | 6/2016 | Ho ...................... G06V 40/1306 324/658 |
| 2019/0019758 A1* | 1/2019 | Kim .................... H01L 21/4853 |
| 2019/0115325 A1* | 4/2019 | Im ......................... H01L 25/105 |

FOREIGN PATENT DOCUMENTS

| | | |
|---|---|---|
| KR | 1020160084666 A | 7/2016 |
| KR | 10-2022-0036598 A | 3/2022 |

* cited by examiner

135

R1

D2
D1
D3

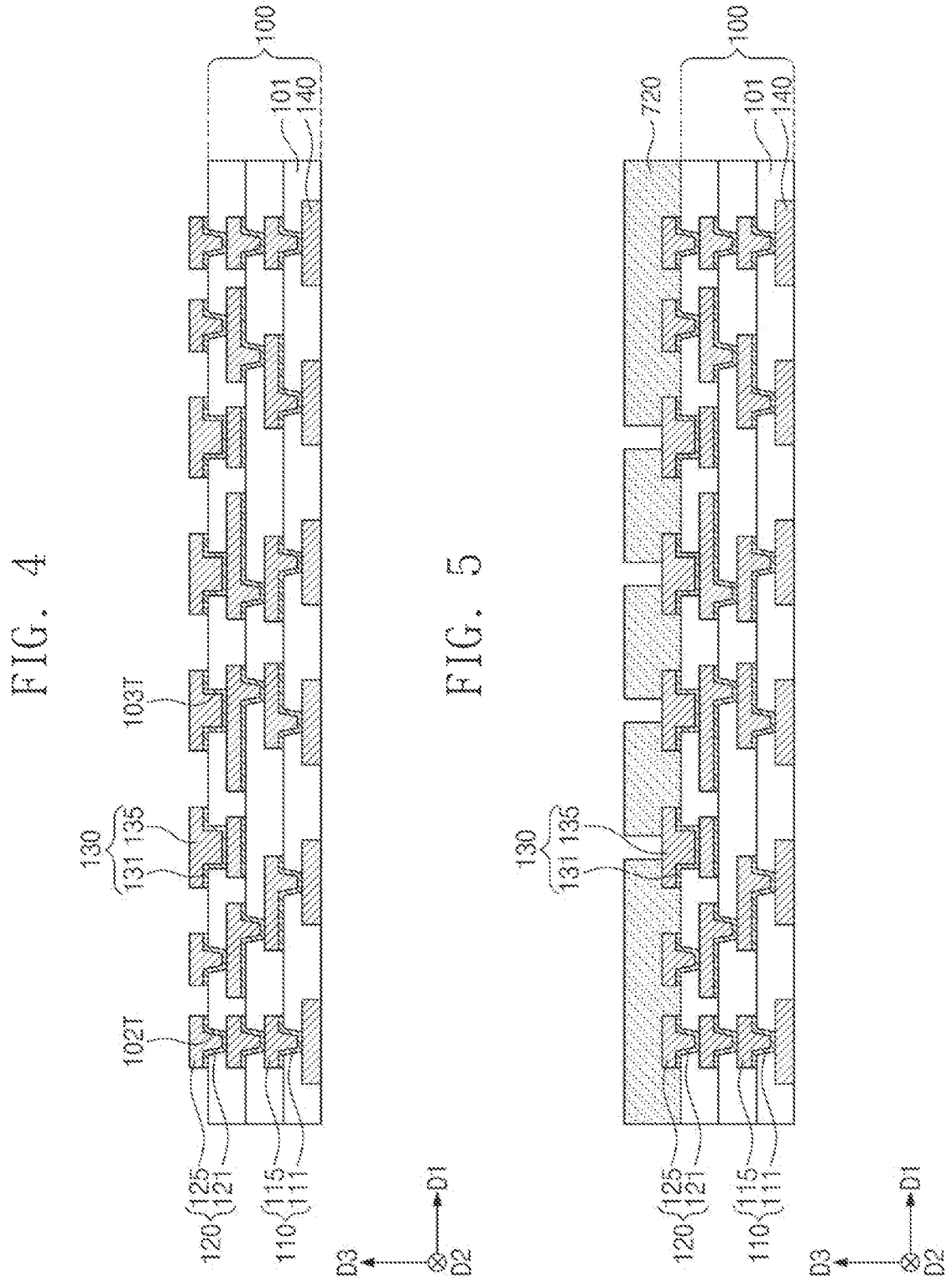

FIG. 13B
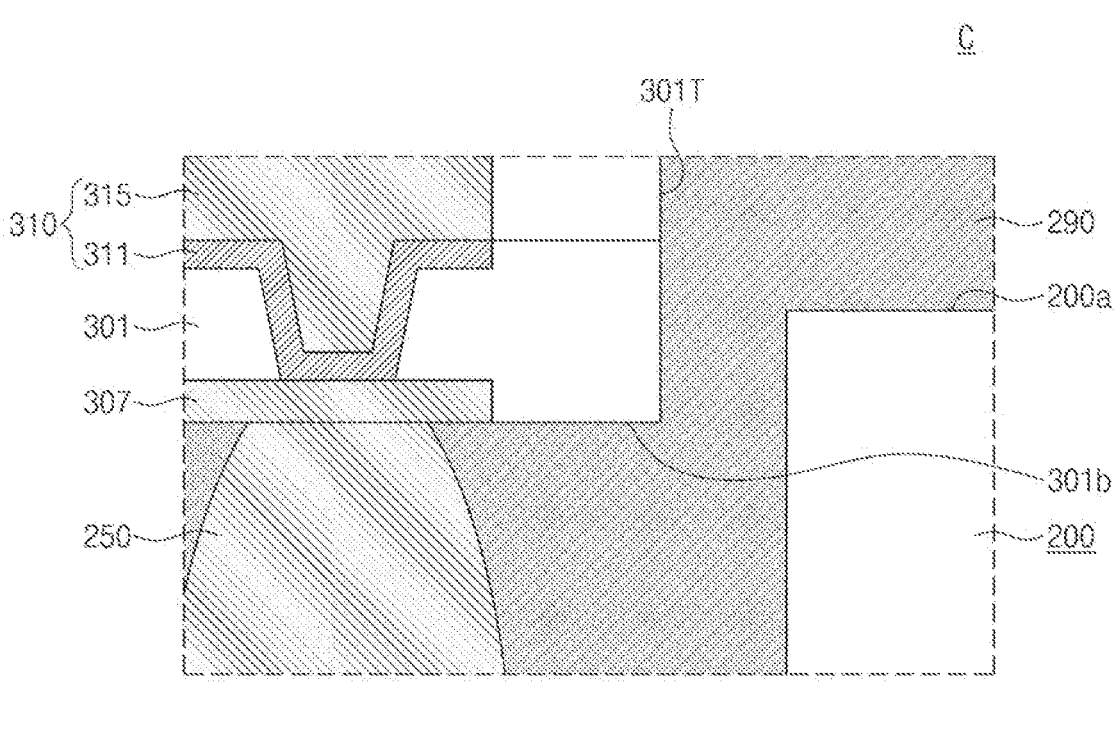
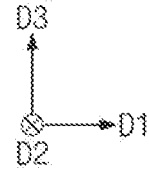

SEMICONDUCTOR PACKAGE WITH INTERPOSER INCLUDING RECESS

CROSS-REFERENCE TO RELATED APPLICATIONS

This application is based on and claims priority under 35 U.S.C. § 119 to Korean Patent Application No. 10-2022-0054187, filed on May 2, 2022, in the Korean Intellectual Property Office, the disclosure of which is incorporated herein by reference in its entirety.

BACKGROUND

The disclosure relates to a semiconductor package, and more particularly, to a semiconductor package having a package on package structure including an interposer.

A semiconductor package may be implemented in a form suitable for using an integrated circuit chip in an electronic product. In general, in a semiconductor package, a semiconductor chip may be mounted on a printed circuit board (PCB) and electrically connected thereto using bonding wirings or bumps. With the recent developments in the electronics industry, a semiconductor package has been variously developed with goals of miniaturization, light-weight, and reduction of manufacturing cost. In particular, as power consumption increases due to high speed and increased capacity, thermal characteristics, such as heat dissipation characteristics, of the semiconductor package are of increased importance.

In particular, in the related art, there is a limit in that the overall thickness of a semiconductor package could not be increased. In addition, in order to prevent a mold void, a distance from an upper surface of the semiconductor chip to an interposer substrate was about 40 μm or more. Thus, in the related art, it is difficult to improve heat dissipation characteristics by increasing the thickness of the semiconductor chip.

SUMMARY

One or more example embodiments provide a semiconductor package which may have improved heat dissipation characteristics.

Additional aspects will be set forth in part in the description which follows and, in part, will be apparent from the description, or may be learned by practice of the presented embodiments.

According to an aspect of an example embodiment, a semiconductor package may include a first package substrate, a first semiconductor chip provided on the first package substrate, an interposer provided on the first semiconductor chip, and a vertical conductive structure provided on the first package substrate and a side surface of the first semiconductor chip, and connecting the first package substrate and the interposer, wherein the interposer includes a first recess vertically overlapping the first semiconductor chip in a lower portion of the interposer, and a lower surface of the interposer defining the first recess is higher than an upper surface of the vertical conductive structure.

According to an aspect of an example embodiment, a semiconductor package may include a first package substrate, a first semiconductor chip provided on the first package substrate, an interposer provided on the first semiconductor chip, a connection terminal provided between the first package substrate and the first semiconductor chip; and a vertical conductive structure provided on the first package substrate and a side surface of the first semiconductor chip, wherein the first package substrate comprises a first pad structure and a second pad structure that are provided in an upper portion of the first package substrate, the first pad structure vertically overlaps the connection terminal, the second pad structure vertically overlaps the vertical conductive structure, the first pad structure includes a recess, the connection terminal fills at least a portion of the recess, and a lower surface of the connection terminal is lower than a lower surface of the vertical conductive structure.

According to an aspect of an example embodiment, a semiconductor package may include a first package substrate including a pad structure provided in an upper portion of the first package substrate, a first semiconductor chip provided on the pad structure, vertical conductive structures provided on the first package substrate and on side surfaces of the first semiconductor chip, a first molding layer covering the first semiconductor chip and an upper surface of the first package substrate, an interposer provided on the first semiconductor chip and the vertical conductive structures, a second package substrate provided on the interposer, a second semiconductor chip provided on the second package substrate, and a second molding layer covering an upper surface of the second package substrate and the second semiconductor chip, where the interposer includes a first part vertically overlapping the first semiconductor chip and a second part surrounding the first part, and a thickness of the first part is less than a thickness of the second part.

BRIEF DESCRIPTION OF THE DRAWINGS

The above and other aspects, features, and advantages of certain example embodiments of the present disclosure will be more apparent from the following description taken in conjunction with the accompanying drawings, in which:

FIGS. 4, 5, 6, 7, 8, 9, 10, 11 and 12 are cross-sectional views of a process of manufacturing the semiconductor package of FIG. 2 according to an example embodiment of the disclosure;

FIG. 13B is a cross-sectional view of part "C" of FIG. 13A according to an example embodiment of the disclosure.

DETAILED DESCRIPTION

Hereinafter, example embodiments according to the disclosure will be described in detail with reference to the accompanying drawings.

Figure 1:
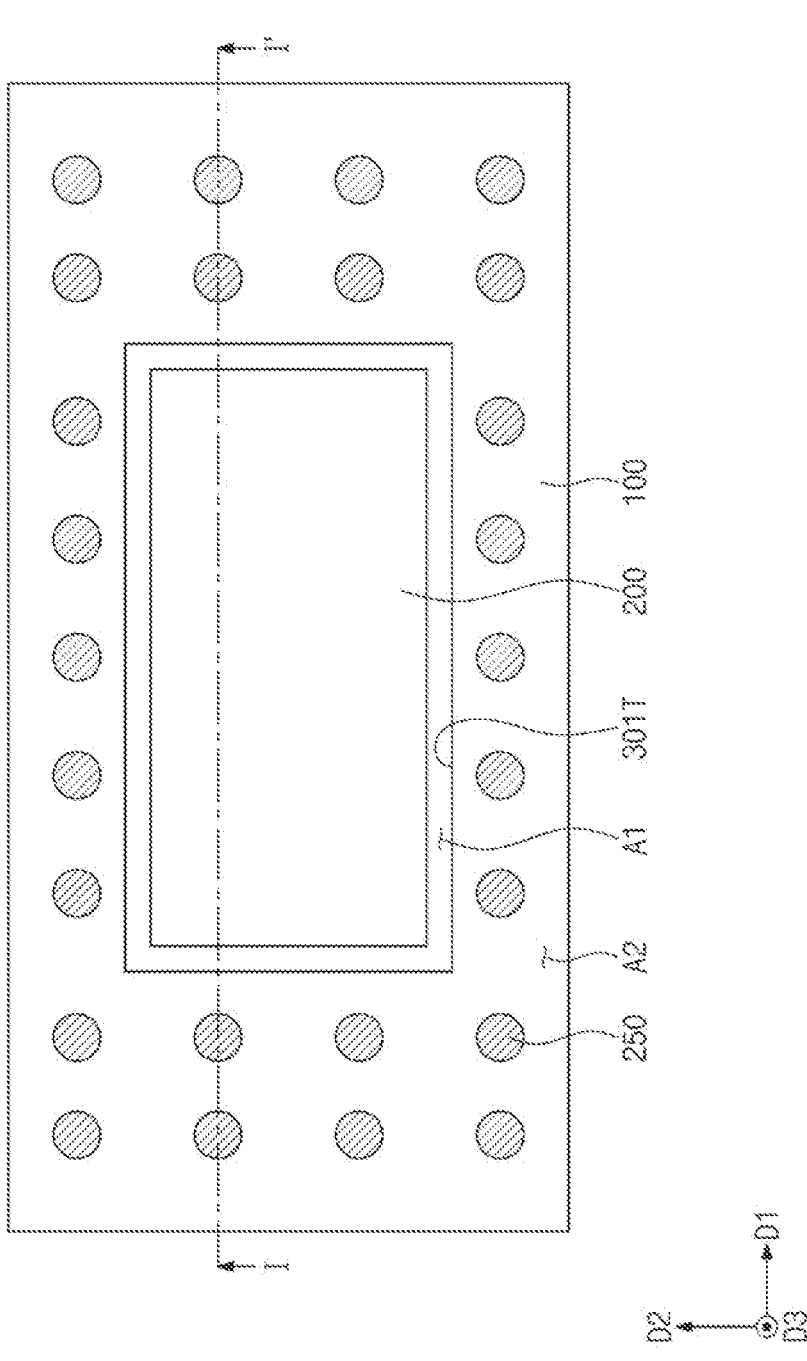
FIG. 1 is a diagram illustrating a semiconductor package according to an example embodiment of the disclosure.

FIG. 1 is a diagram illustrating a semiconductor package according to an example embodiment of the disclosure. FIG.

2 is a cross-sectional view taken along line IT of FIG. 1 according to an example embodiment of the disclosure. FIG. 3A is a cross-sectional view of part "A" of FIG. 2 according to an example embodiment of the disclosure. FIG. 3B is a diagram of a first pad structure of FIG. 3A according to an example embodiment of the disclosure FIG. 3C is a cross-sectional view of part "B" of FIG. 2 according to an example embodiment of the disclosure.

Figure 2:
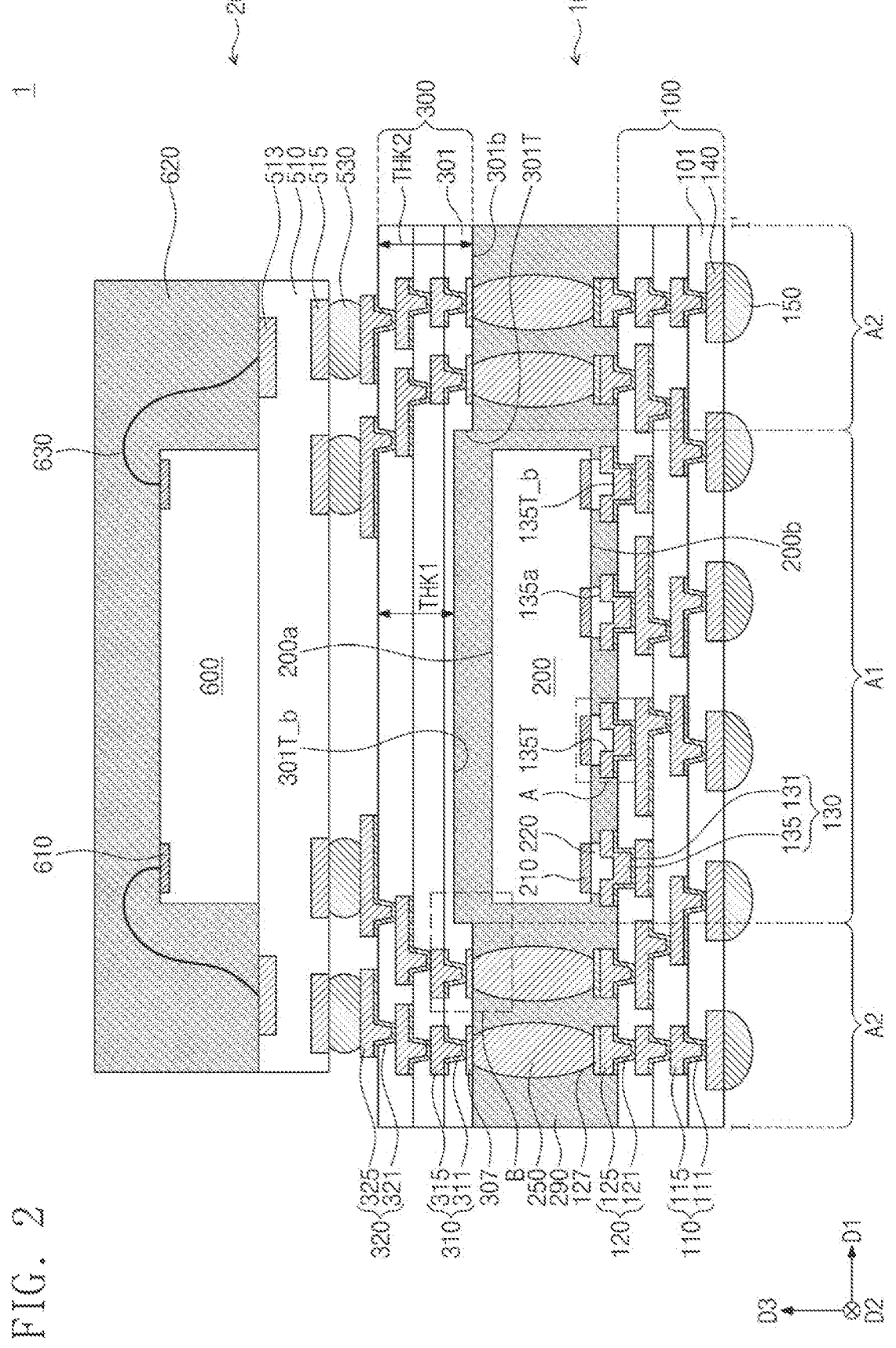
FIG. 2 is a cross-sectional view taken along line I-I' of FIG. 1 according to an example embodiment of the disclosure.
Figure 3A:
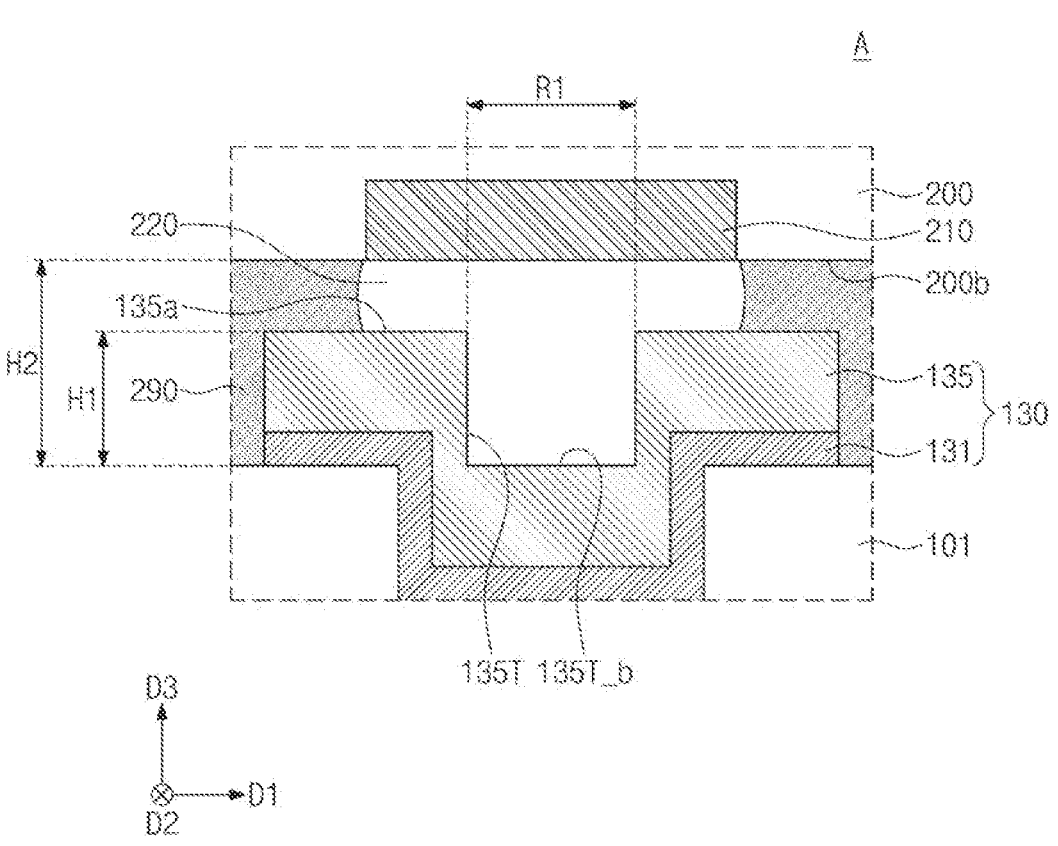
FIG. 3A is a cross-sectional view of part "A" of FIG. 2 according to an example embodiment of the disclosure.
Figure 3B:
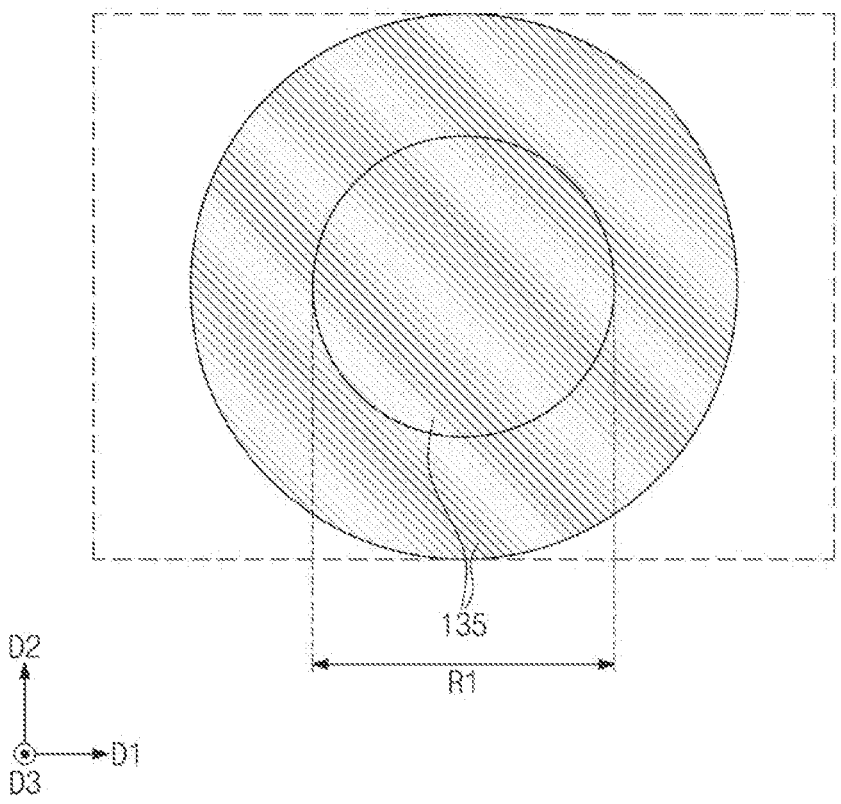
FIG. 3B is a diagram of a first pad structure of FIG. 3A according to an example embodiment of the disclosure.
Figure 3C:
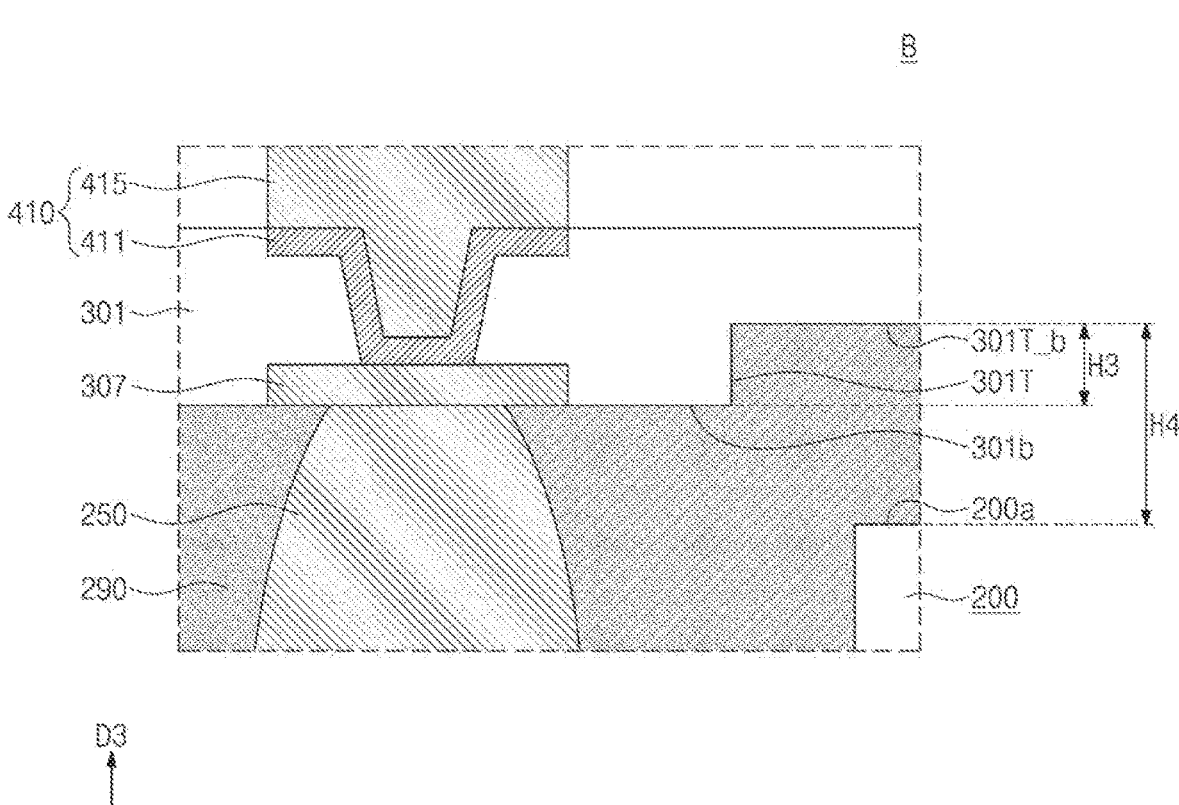
FIG. 3C is a cross-sectional view of part "B" of FIG. 2 according to an example embodiment of the disclosure.

Referring to FIGS. 1 and 2, a semiconductor package 1 may include a first package 10, a second package 20 on the first package 10, and an interposer 300 therebetween.

The first package 10 may include a first package substrate 100, a first semiconductor chip 200, vertical conductive structures 250, and a first molding layer 290.

The first package substrate 100 may be, for example, a printed circuit board (PCB). The first package substrate 100 may be a multilayer PCB in which an insulating layer and a wiring layer are alternately stacked. The first package substrate 100 may include a first insulating layer 101, a first wiring pattern 110, a first pad structure 120, a second pad structure 130, and an under bump pattern 140. The first package substrate 100 may include a plurality of first insulating layers 101 which may be stacked. However, the number of the stacked first insulating layers 101 is not limited, and may be variously modified. In example embodiments including a plurality of first insulating layers 101, the plurality of first insulating layers 101 may include the same material as each other, and an interface between the plurality of first insulating layers 101 may not be distinguished. In another example embodiment, the interface between the plurality of first insulating layers 101 may be distinguished.

The first package substrate 100 may be a single-layer PCB having signal patterns on an upper surface and a lower surface of the first package substrate 100. Alternatively, the first package substrate 100 may be a redistribution substrate or a redistribution layer.

Herein, a first direction D1 is defined as a direction parallel to an upper surface of the first package substrate 100, a second direction D2 is defined as a direction parallel to the upper surface of the first package substrate 100 crossing the direction D1, and a third direction D3 is defined as a direction perpendicular to the upper surface of the first package substrate 100.

The under bump pattern 140 may be provided in a lower portion of the first package substrate 100. The first package substrate 100 may include a plurality of under bump patterns 140. The plurality of under bump patterns 140 may be horizontally spaced apart from each other. The under bump pattern 140 may include a conductive metal material, for example, copper (Cu).

The first wiring pattern 110 may be provided in the first package substrate 100. The first wiring pattern 110 may be disposed on the under bump patterns 140. The first package substrate 100 may include a plurality of first wiring patterns 110. The plurality of first wiring patterns 110 may be stacked. For example, the lower first wiring pattern 110 may contact the under bump patterns 140. However, the number of the first wiring patterns 110 stacked is not limited as the illustrated, and may be variously modified. The first wiring pattern 110 may be electrically connected to at least one of the plurality of under bump patterns 140. Each of the plurality of first wiring patterns 110 may include a first seed pattern 111 and a first conductive pattern 115. Herein, that two components are electrically connected/coupled may include that the components are directly or that the components are indirectly connected/coupled through another conductive component.

The first conductive pattern 115 may be disposed on the first seed pattern 111. The first conductive pattern 115 may include a first via portion and a first wiring portion on the first via portion. The first wiring portion and the first via portion may be connected without an interface. The first wiring portion and the first via portion may include the same material. The first via portion may have a shape protruding toward a lower surface of the first package substrate 100. The first via portion may be provided in the corresponding first insulating layer 101, and the first wiring portion may extend onto an upper surface of the corresponding first insulating layer 101. The first conductive pattern 115 may include a conductive metal material, for example, copper (Cu).

The first seed pattern 111 may be provided on a lower surface of the first conductive pattern 115. The first seed pattern 111 may be interposed between the first conductive pattern 115 and the first insulating layer 101. The first seed pattern 111 may include a conductive metal material, for example, copper (Cu), titanium (Ti), and/or an alloy thereof.

According to example embodiments, the first seed pattern 111 may be omitted.

An upper surface of the upper first wiring pattern 110 may be partially exposed. The first pad structure 120 and the second pad structure 130 may be provided on the first insulating layer 101. The first pad structure 120 may be provided to be horizontally spaced apart from the first semiconductor chip 200. The first package substrate 100 may include a plurality of first pad structures 120, and the plurality of first pad structures 120 may be horizontally spaced apart from each other. Upper surfaces of the plurality of first pad structures 120 may be exposed on the first insulating layer 103. The first pad structure 120 may be electrically connected to at least one of the plurality of first wiring patterns 110. Each first pad structure 120 may include a first pad seed pattern 121 and a first pad conductive pattern 125.

The first pad conductive pattern 125 may be disposed on the first pad seed pattern 121. The first pad conductive pattern 125 may include a first pad via portion and a first pad wiring portion on the first pad via portion. The first pad wiring portion and the first pad via portion may be connected without an interface. The first pad wiring portion and the first pad via portion may include the same material. The first pad via portion may have a shape that protrudes toward the lower surface of the first package substrate 100. The first pad via portion may be provided in the first insulating layer 101, and the first pad wiring portion may extend onto the upper surface of the first insulating layer 101. The first pad conductive pattern 125 may include a conductive metal material, for example, copper (Cu).

The first pad seed pattern 121 may be provided on a lower surface of the first pad conductive pattern 125. The first pad seed pattern 121 may be interposed between the first pad conductive pattern 125 and the first insulating layer 101. The first pad seed pattern 121 may be interposed between a lower surface of the first pad wiring portion and the first insulating layer 101, between a sidewall of the first pad via portion and the first insulating layer 101, and between the lower surface of the first pad via portion and the corresponding first wiring pattern 110. The first pad seed pattern 121 may be in direct contact with the first wiring portion of the corresponding first wiring pattern 110 adjacent to the lower surface thereof. The first pad seed pattern 121 may include a conductive metal material, for example, copper (Cu), titanium (Ti), and/or an alloy thereof.

In example embodiments, the first pad seed pattern 121 may be omitted. This may vary depending on the characteristics of the semiconductor package 1 to be manufactured.

Referring to FIGS. 2, 3A, and 3B, the second pad structure 130 may be provided to be vertically (e.g., in the third direction D3) overlapped with the first semiconductor chip 200. The first package substrate 100 may include a plurality of second pad structures 130, and the plurality of second pad structures 130 may be horizontally spaced apart from each other. For example, a level of an upper surface of the second pad structure 130 may be substantially the same as a level of the upper surface of the first pad structure 120. The second pad structure 130 may be electrically connected to at least one of the plurality of first wiring patterns 110. Each second pad structure 130 may include a second pad seed pattern 131 and a second pad conductive pattern 135.

The second pad conductive pattern 135 may be disposed on the second pad seed pattern 131. The second pad conductive pattern 135 may include a conductive metal material, for example, copper (Cu).

The second pad seed pattern 131 may be provided on a lower surface of the second pad conductive pattern 135. The second pad seed pattern 131 may be interposed between the second pad conductive pattern 135 and the first insulating layer 101. The second pad seed pattern 131 may be in direct contact with the first wiring portion of the corresponding first wiring pattern 110 adjacent to the lower surface thereof. The second pad seed pattern 131 may include a conductive metal material, for example, copper (Cu), titanium (Ti), and/or an alloy thereof.

Referring to FIG. 3A, the second pad structure 130 may include a first recess 135T facing the first package substrate 100. The first recess 135T may not completely penetrate the second pad structure 130. A distance in the third direction D3 from the lower surface 135T_b of the second pad structure 130 defining the first recess 135T to the upper surface 135a of the second pad structure 130 is defined as a height H1. The first height H1 may be about 5 μm to about 10 μm. A level of the lower surface 135T_b of the second pad structure 130 defining the first recess 135T may be higher than a level of the upper surface of the first insulating layer 101. According to an example embodiment, the level of the lower surface 135T_b of the second pad structure 130 defining the first recess 135T may be equal to or lower than the level of the upper surface of the first insulating layer 101. Referring to FIG. 3B, the second pad structure 130 may have a ring shape in which a center is filled. A diameter R1 of an inner perimeter of the second pad structure 130 defining the first recess 135T may be about 20 μm to about 40 μm.

Referring back to FIG. 2, an external terminal 150 may be provided under the first package substrate 100. The first package 10 may include a plurality of external terminals 150, and the plurality of external terminals 150 may be horizontally spaced apart from each other. The plurality of external terminals 150 may be disposed on lower surfaces of the plurality of under bump patterns 140, respectively. In this case, the plurality of under bump patterns 140 may function as pads of the plurality external terminals 150. The external terminal 150 may include at least one of solder, pillar, and bump. The external terminal 150 may include a conductive metal material. The external terminal 150 may include at least one of, for example, tin (Sn), lead (Pb), nickel (Ni), gold (Au), silver (Ag), copper (Cu), aluminum (Al), and bismuth (Bi). The external terminal 150 may be connected to an external device.

The first semiconductor chip 200 may be mounted on the upper surface of the first package substrate 100. The first semiconductor chip 200 may be, for example, a memory chip, a logic chip, or a sensing chip, but is not limited thereto. A thickness of the first semiconductor chip 200 may vary depending on a design of the semiconductor package 1. For example, the thickness of the first semiconductor chip 200 may be about 110 μm to about 123 μm.

The first semiconductor chip 200 may include a first chip pad 210 disposed on a lower portion thereof. The first semiconductor chip 200 may include a plurality of first chip pads 210. The first chip pad 210 may be electrically connected integrated circuits of the first semiconductor chip 200 through wirings in the first semiconductor chip 200. The first chip pad 210 may include a conductive metal material.

A first connection terminal 220 may be provided on the first package substrate 100. The first semiconductor chip 200 may include a plurality of first connection terminals 220, and the plurality of first connection terminals 220 may be horizontally spaced apart from each other. The plurality first connection terminals 220 may be interposed between the first package substrate 100 and the first semiconductor chip 200. The first connection terminal 220 may vertically overlap the second pad structure 130 and the first chip pad 210. The first connection terminal 220 may be interposed between the second pad structure 130 and the first chip pad 210 to electrically connect the second pad structure 130 and the first chip pad 210. The first semiconductor chip 200 may be electrically connected to the first package substrate 100 through the first connection terminals 220.

As shown in FIG. 3A, a level of the lower surface of the first connection terminal 220 may be lower than a level of the upper surface 135a of the second pad structure 130. Conversely, the level of the upper surface 135a of the second pad structure 130 may be higher than the level of the lower surface of the first connection terminal 220. The first connection terminal 220 may fill at least a portion of the first recess 135T. For example, the first connection terminal 220 may be in contact with an inner wall of the second pad structure 130 defining the first recess 135T. The first connection terminal 220 may include at least one of solder, a pillar, and a bump. The first connection terminal 220 may include a conductive metal material. The first connection terminal 220 may include at least one of, for example, tin (Sn), lead (Pb), nickel (Ni), gold (Au), silver (Ag), copper (Cu), aluminum (Al), and bismuth (Bi).

A distance in the third direction D3 from the lower surface 200b of the first semiconductor chip 200 to the upper surface of the first insulating layer 101 is defined as a second height H2.

In general, heat generated in the first semiconductor chip 200 may increase a temperature in the semiconductor package 1 and deteriorate driving characteristics of the semiconductor package 1.

The semiconductor package 1 according an embodiment to the disclosure may include the second pad structure 130 vertically overlapping the first semiconductor chip 200 on the first package substrate 100, and the second pad structure 130 may include the first recess 135T. Accordingly, the first connection terminal 220 interposed between the first semiconductor chip 200 and the second pad structure 130 may fill at least a portion of the first recess 135T, and thus the distance (i.e., the second height H2) between the first package substrate 100 and the first semiconductor chip 200 may be reduced. Accordingly, the thickness of the first semiconductor chip 200 may be increased while maintaining the overall thickness of the semiconductor package 1, and thus heat dissipation characteristics of the semiconductor package may be improved.

In addition, the first connection terminal 220 may contact the inner wall of the first pad structure 130 defining the first recess 135T, and thus a contact area between the second pad structure 130 and the first connection terminal 220 may increase. Accordingly, electrical reliability of the semiconductor package 1 may be improved.

Referring back to FIGS. 1 and 2, the vertical conductive structure 250 may be disposed on the first package substrate 100. The semiconductor package 1 may include a plurality of vertical conductive structures 250, and the plurality of vertical conductive structures 250 may be horizontally spaced apart from each other. The vertical conductive structure 250 may be disposed on a side surface of the first semiconductor chip 200. The vertical conductive structure 250 may be disposed on an edge region of the first package substrate 100 in a plan view. The vertical conductive structure 250 may vertically overlap the first pad structure 120. A level of the lower surface of the vertical conductive structure 250 may be higher than the level of the lower surface of the first connection terminal 220. Conversely, the level of the lower surface of the first connection terminal 220 may be lower than the level of the lower surface of the vertical conductive structure 250.

The vertical conductive structure 250 may be electrically connected to at least one of the plurality of first wiring patterns 110. For example, the vertical conductive structure 250 may be a metal pillar. The vertical conductive structure 250 may include, for example, tin (Sn), silver (Ag), copper (Cu), or an alloy thereof.

A first metal pattern 127 may be interposed between the vertical conductive structure 250 and the first pad structure 120 to be connected to the corresponding first pad structure 120 and the vertical conductive structure 250. The first metal pattern 127 may include, for example, gold (Au), or nickel (Ni).

The first molding layer 290 may be provided on the first package substrate 100. The first molding layer 290 may cover an upper surface of the first package substrate 100. The first molding layer 290 may cover an upper surface 200a, sidewalls, and a lower surface 200b of the first semiconductor chip 200. The first molding layer 290 may cover side surfaces of the vertical conductive structures 250. The first molding layer 290 may be interposed between the first connection terminals 220 to cover side surfaces of the first connection terminals 220. The first molding layer 290 may include, for example, an insulating polymer such as an epoxy-based molding compound. According to example embodiments, an underfill material may be interposed between the lower surface 200b of the first semiconductor chip 200 and the upper surface of the first package substrate 100. The underfill material may cover the side surfaces of the first connection terminals 220.

The interposer 300 may be provided on the first package substrate 100. The interposer 300 may be disposed on the first molding layer 290. The interposer 300 may be any one of a silicon interposer, a PCB, and a redistribution substrate (or a redistribution layer).

For example, when the interposer 300 is a PCB, the interposer 300 may include a second insulating layer 301, a second wiring pattern 310, and a third pad structure 320. The second insulating layer 301 may be provided in the plural and stacked. However, the number of stacked second insulating layers 301 is not limited thereto, and may be variously modified. In example embodiments, the plurality of second insulating layers 301 may include the same material as etch other, and an interface between the second insulating layers 301 may not be distinguished.

Referring to FIGS. 1, 2, and 3C, the interposer 300 may include a second recess 301T that vertically overlaps the first semiconductor chip 200. The second recess 301T may be a concave region in the third direction D3 of the interposer 300 or in a direction away from the first semiconductor chip 200. The second recess 301T may not completely penetrate the interposer 300. As illustrated in FIG. 1, in a plan view, the first semiconductor chip 200 may be disposed in the second recess 301T.

A level of a lower surface 301T_b of the interposer 300 defining the second recess 301T may be higher than a level of the upper surface of the vertical conductive structure 250.

A distance in the third direction D3 from the lower surface 301b of the interposer 300 to the lower surface 301T_b of the interposer 300 defining the second recess 301T is defined as a third height H3. For example, the third height H3 may be about 10 μm to about 15 μm. In other words, the maximum depth of the second recess 301T may be about 10 μm to about 15 μm. The interposer 300 may include a first part A1 that vertically overlaps the first semiconductor chip 200 and a second part A2 that surrounds the first part A1. A thickness THK1 of the first part A1 may be thinner than a thickness THK2 of the second part A2. A difference between the thickness THK2 of the second part A2 and the thickness THK1 of the first part A1 may be about 10 μm to about 15 μm.

A distance in the third direction D3 from the upper surface 200a of the first semiconductor chip 200 to the lower surface 301T_b of the interposer 300 defining the second recess 301T is defined as a fourth height H4. For example, the fourth height H4 may be about 40 μm to about 60 μm.

The first molding layer 290 may fill the second recess 301T. A level of an upper surface of the first molding layer 290 may be higher than a level of the lower surface 301b of the interposer 300.

According to example embodiments, the interposer 300 on the first semiconductor chip 200 may include the second recess 301T that vertically overlaps the first semiconductor chip 200. Accordingly, while maintaining the distance from the upper surface 200a of the first semiconductor chip 200 to the lower surface 301T_b of the interposer 300 defining the second recess 301T as it is, the thickness of the first semiconductor chip 200 may be increased. Accordingly, the heat dissipation characteristics of the semiconductor package 1 may be improved.

In addition, the second recess 301T may be provided, and thus the thickness of the first semiconductor chip 200 may be increased while maintaining the fourth height H4 as it is. Accordingly, the first molding layer 290 may easily fill a space between the interposer 300 and the first semiconductor chip 200, thereby preventing voids from being generated in the first molding layer 290. Accordingly, physical characteristics and insulating characteristics of the first molding layer 290 may be improved, and reliability of the semiconductor package 1 may be improved.

Referring back to FIG. 2, the semiconductor package 1 may include a plurality of second wiring patterns 310. The plurality of second wiring patterns 310 may be stacked. However, the number of stacked second wiring patterns 310 is not limited as the illustrated, and may be variously modified. A second metal pattern 307 may be interposed between the second wiring pattern 310 and the vertical conductive structure 250. The semiconductor package 1 may include a plurality of second metal patterns 307. The second metal pattern 307 may include a conductive metal material, for example, gold (Au), or nickel (Ni).

The second wiring pattern 310 may be electrically connected to the corresponding vertical conductive structure 250 through the second metal pattern 307. Each second wiring pattern 310 may include a second seed pattern 311 and a second conductive pattern 315. Each of the second seed pattern 311 and the second conductive pattern 315 may include the same structure and material as that of the first seed pattern 111 and the first conductive pattern 115.

The third pad structure 320 may be provided on the second insulating layer 301. The semiconductor package 1 may include a plurality of third pad structures 320, and the plurality of third pad structures 320 may be horizontally spaced apart from each other. Upper surfaces of the plurality of third pad structures 320 may be exposed on the second insulating layer 301. The third pad structure 320 may be electrically connected to at least one of the plurality of second wiring patterns 310. Each third pad structure 320 may include a third pad seed pattern 321 and a third pad conductive pattern 325.

The third pad conductive pattern 325 may be disposed on the third pad seed pattern 321. The third pad conductive pattern 325 may include a second pad via portion and a second pad wiring portion on the second pad via portion. The second pad wiring portion and the second pad via portion may be connected without an interface. The second pad wiring portion and the second pad via portion may include the same material. The second pad via portion may be provided in the second insulating layer 301, and the second pad wiring portion may extend onto an upper surface of the second insulating layer 301. The third pad conductive pattern 325 may include a conductive metal material, for example, copper (Cu).

The third pad seed pattern 321 may be provided on a lower surface of the third pad conductive pattern 325. The third pad seed pattern 321 may be interposed between the third pad conductive pattern 325 and the second insulating layer 301. The third pad seed pattern 321 may include a conductive metal material, for example, copper (Cu), titanium (Ti), and/or an alloy thereof.

The second package 20 may be provided on the first package 10. The second package 20 may include a second semiconductor chip 600, a second package substrate 510, a second molding layer 620, and a wire bonding 630.

The second semiconductor chip 600 may be mounted on the upper surface of the interposer 300. The second semiconductor chip 600 may be, for example, a memory chip, a logic chip, or a sensing chip, but is not limited thereto. The memory chip may be, for example, dynamic random access memory (DRAM), static RAM (SRAM), magnetoresistive RAM (MRAM), flash memory, etc. A plurality of second semiconductor chips 600 may be provided. The second semiconductor chip 600 may include second chip pads 610 adjacent to an upper portion thereof. The second chip pads 610 may be electrically connected to integrated circuits of the second semiconductor chip 600 through wirings in the second semiconductor chip 600. The second chip pads 610 may include a conductive metal material, for example, copper (Cu).

The second package substrate 510 may be provided between the second semiconductor chip 600 and the interposer 300. The second package substrate 510 may be a PCB or a redistribution board. The second package substrate 510 may include first package pads 513 adjacent to an upper portion thereof and second package pads 515 adjacent to a lower portion thereof. The first package pads 513 and the second package pads 515 may be electrically connected to each other by an internal circuit pattern of the second package substrate 510.

The wire bonding 630 connecting the second chip pads 610 of the second semiconductor chip 600 and the first package pads 513 of the second package substrate 510 may be provided. The wire bonding 630 may electrically connect the second semiconductor chip 600 and the second package substrate 510.

The second molding layer 620 may be provided on the second package substrate 510. The second molding layer 620 may cover an upper surface and a side surface of the second semiconductor chip 600 and a portion of the upper surface of the second package substrate 510. The second molding layer 620 may cover the wire bonding 630. The second molding layer 620 may include, for example, an insulating polymer such as an epoxy-based molding compound.

A second connection terminal 530 may be interposed between the interposer 300 and the second semiconductor chip 600. The second connection terminal 530 may be interposed between the interposer 300 and the second package substrate 510. The semiconductor package 1 may include a plurality of second connection terminal 530, and the plurality of second connection terminals 530 may be horizontally spaced apart from each other. The second connection terminal 530 may be interposed between the third pad structure 320 and the second package pad 515. Each second connection terminal 530 may contact an upper surface of the third pad structure 320. Each second connection terminal 530 may contact lower surfaces of the second package pads 515. The third pad structure 320 and the second package pad 515 may be electrically connected to each other through the second connection terminal 530. The second semiconductor chip 600 may be electrically connected to the interposer 300 through the second connection terminal 530. The second connection terminal 530 may include at least one of solder, a pillar, and a bump. The second connection terminal 530 may include a conductive metal material. The second connection terminal 530 may include at least one of, for example, tin (Sn), lead (Pb), nickel (Ni), gold (Au), silver (Ag), copper (Cu), aluminum (Al), and bismuth (Bi).

FIGS. 4, 5, 6, 7, 8, 9, 10, 11 and 12 are cross-sectional views of a process of manufacturing the semiconductor package of FIG. 2 according to an example embodiment of the disclosure.

Referring to FIG. 4, a first package substrate 100 may be provided.

The upper first insulating layer 101 may include first openings 102T in which first pad structures 120 are to be formed and second openings 103T in which second pad structures 130 are to be formed.

The first pad structures 120 and the second pad structures 130 may be formed. Forming the first pad structures 120 may include forming first pad seed patterns 121 and first pad conductive patterns 125. Forming the second pad structures 130 may include forming second pad seed patterns 131 and second pad conductive patterns 135.

Forming the first pad structures 120 and the second pad structures 130 may include forming a seed layer in the first and second openings 102T and 103T and on the upper surface of the upper first insulating layer 101, forming a resist pattern on the seed layer, and performing an electroplating process using the seed layer as an electrode. The first conductive pad conductive patterns 125 and the second conductive pad conductive patterns 135 may be formed by the electroplating process.

Thereafter, the method may include removing the resist pattern and the exposed seed layer using an etching process. The first pad seed patterns 121 and the second pad seed patterns 131 may be formed together while the seed layer is removed.

Referring to FIG. 5, a first resist pattern 720 may be formed on the first insulating layer 101. Forming the first resist pattern 720 may include applying a photo resist (PR) on the first insulating layer 101 and then performing an exposure and development process. The first resist pattern 720 may expose only a portion of upper surfaces of the second pad structures 130.

Figure 6:
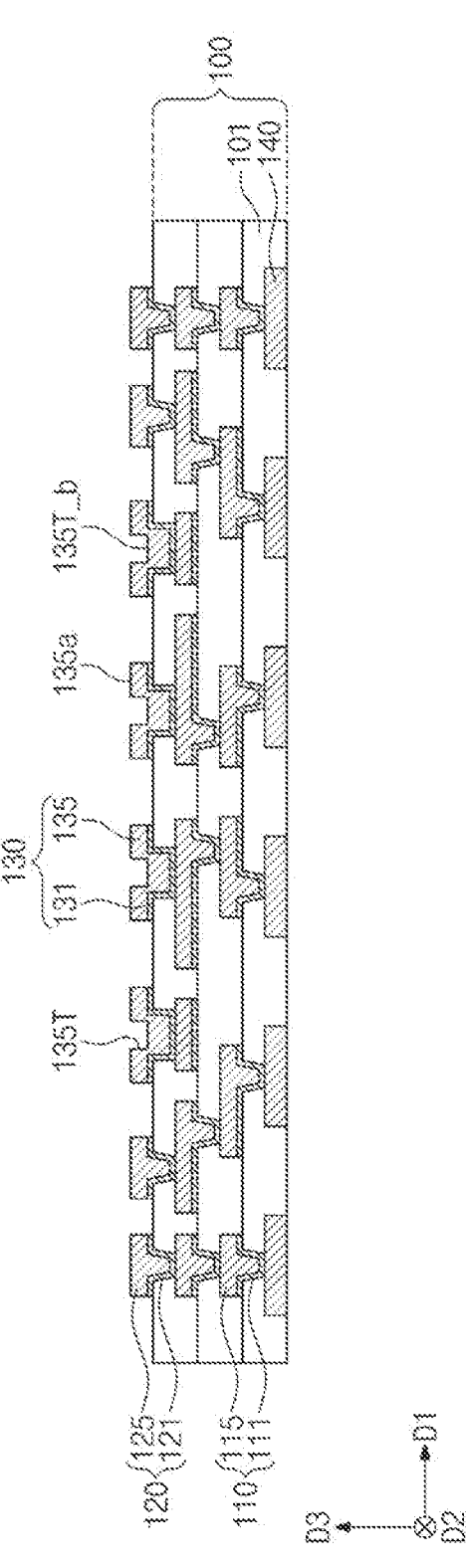

Referring to FIGS. 5 and 6, an etching process may be performed to form a first recess 135T in the second pad structures 130. The etching process may be performed using a dry etch process. Thereafter, the first resist pattern 720 may be removed. A strip or a cleaning process may be used to remove the first resist pattern 720. Accordingly, the first pad structures 120 and the second pad structures 130 may be formed.

Figure 7:
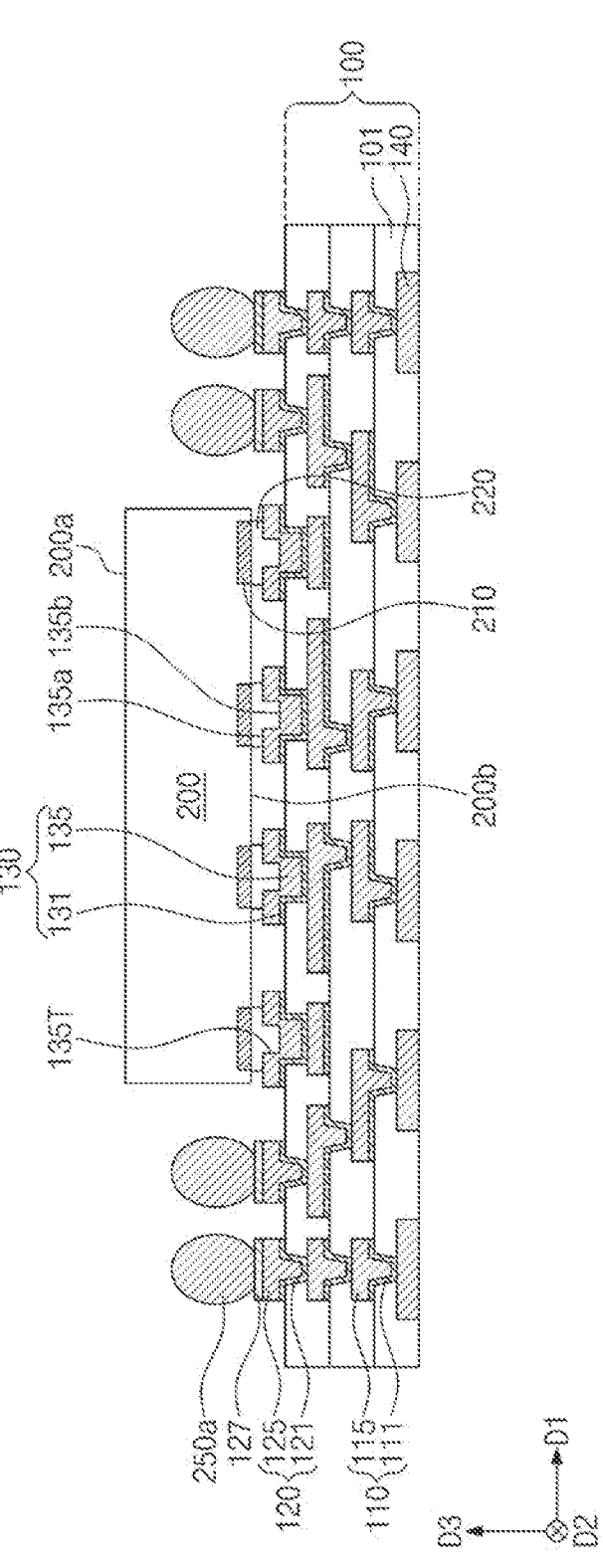

Referring to FIG. 7, a first semiconductor chip 200 may be mounted on the first package substrate 100. The first semiconductor chip 200 may include first chip pads 210 adjacent to a lower portion thereof. Mounting the first semiconductor chip 200 may include forming first connection terminals 220 between the first package substrate 100 and the first semiconductor chip 200. A first metal pattern 127 may be formed on the first pad structures 120. A first conductive ball 250a may be formed on the first metal pattern 127. A plurality of first conductive balls 250a may be provided.

Figures 8, 9:
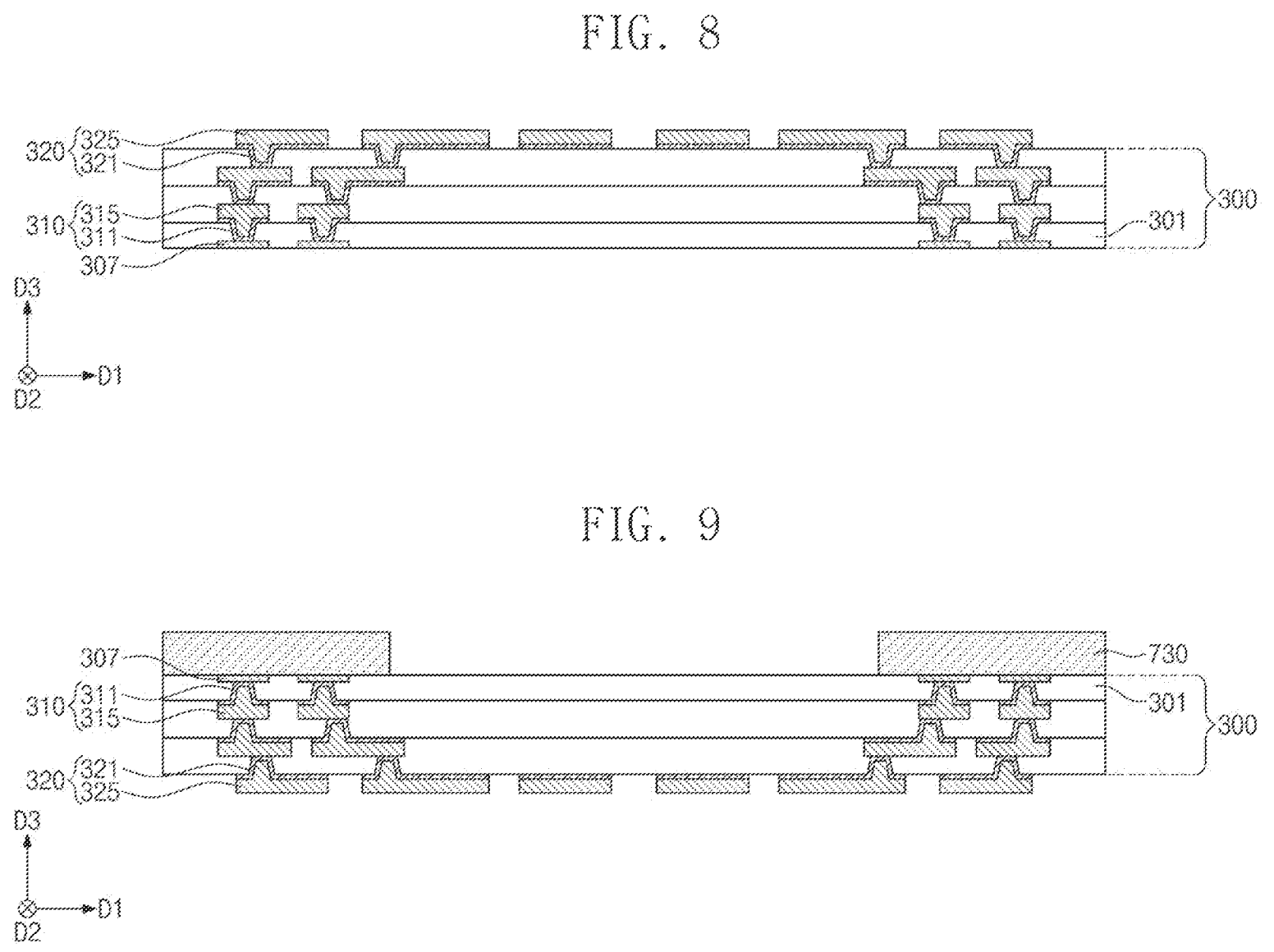

Referring to FIG. 8, an interposer 300 may be formed separately from the first package substrate 100. A second insulating layer 301 may cover second metal patterns 307.

Second wiring patterns 310 may be formed. Forming the second wiring patterns 310 may include forming second seed patterns 311 and second conductive patterns 315. Third pad structures 320 may be formed on the upper second insulating layer 301. Forming the third pad structures 320 may include forming third pad seed patterns 321 and third pad conductive patterns 325. The process of forming the third pad structures 320 may be performed in the same manner as the process of forming the first pad structures 120 described with reference to FIG. 4.

Referring to FIG. 9, the interposer 300 may be rotated 180 degrees (e.g., flipped). The upper surface of the interposer 300 in FIG. 8 may be the lower surface of the interposer 300 in FIG. 9, and the lower surface of the interposer 300 in FIG. 7 may be the upper surface of the interposer 300 in FIG. 9. A second resist pattern 730 may be formed on the upper surface of the interposer 300. Forming the second resist pattern 730 may include applying a PR on the second insulating layer 301 and then performing a photo process. The second resist pattern 730 may expose a portion where a second recess 301T, which will be described later with reference to FIG. 10, is to be formed.

Figures 10, 11:
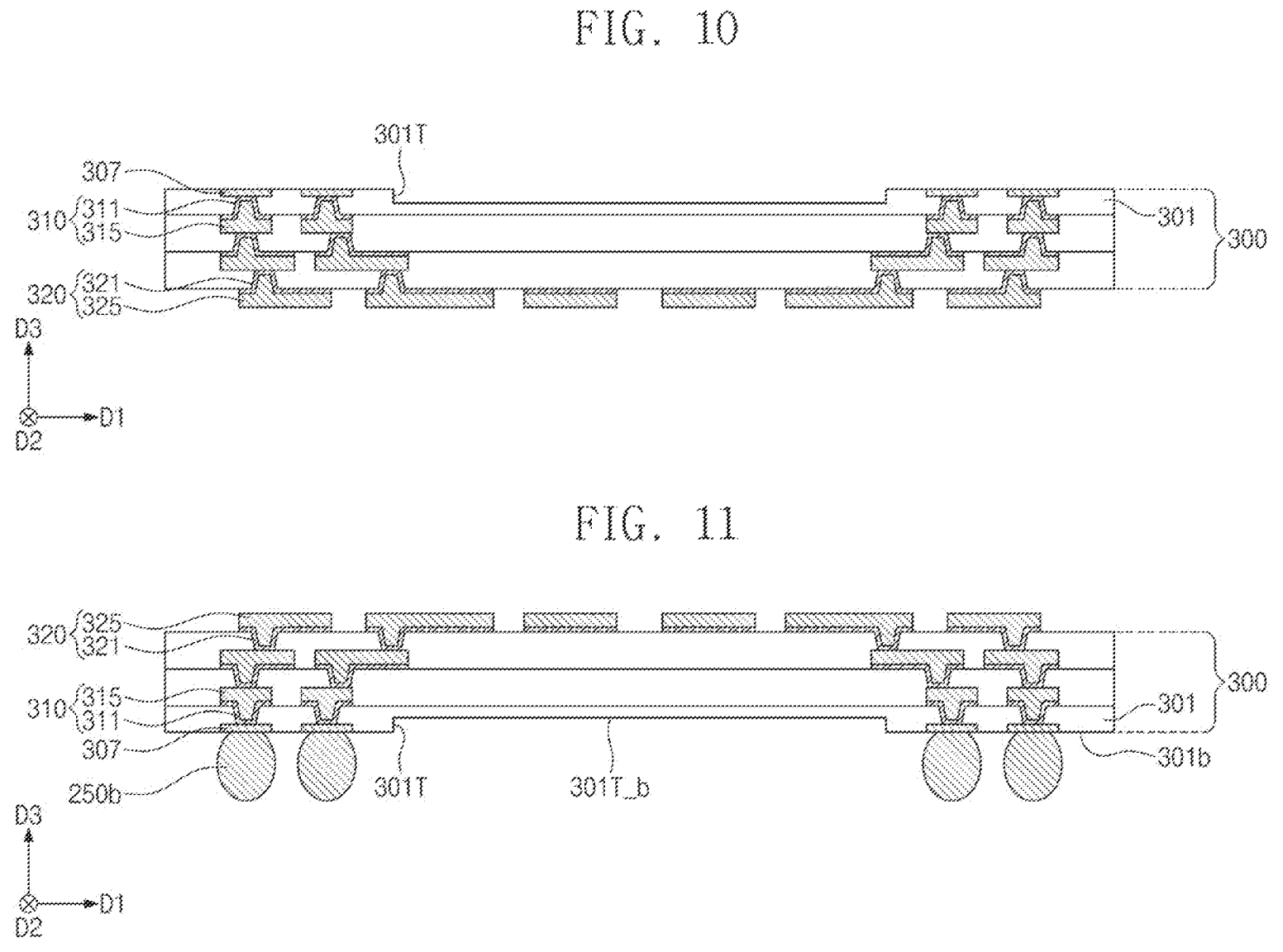

Referring to FIG. 10, an etching process may be performed to form the second recess 301T in the interposer 300. The etching process may be performed using a dry etch process. Thereafter, the second resist pattern 730 may be removed. A strip or a cleaning process may be used to remove the second resist pattern 730.

Referring to FIG. 11, a second conductive ball 250b may be formed on the interposer 300 in FIG. 10. A plurality of second conductive balls 250b may be provided. The second conductive ball 250b may vertically overlap the second metal pattern 307. Thereafter, the interposer 300 and the second conductive ball 250b may be rotated 180 degrees.

Figure 12:
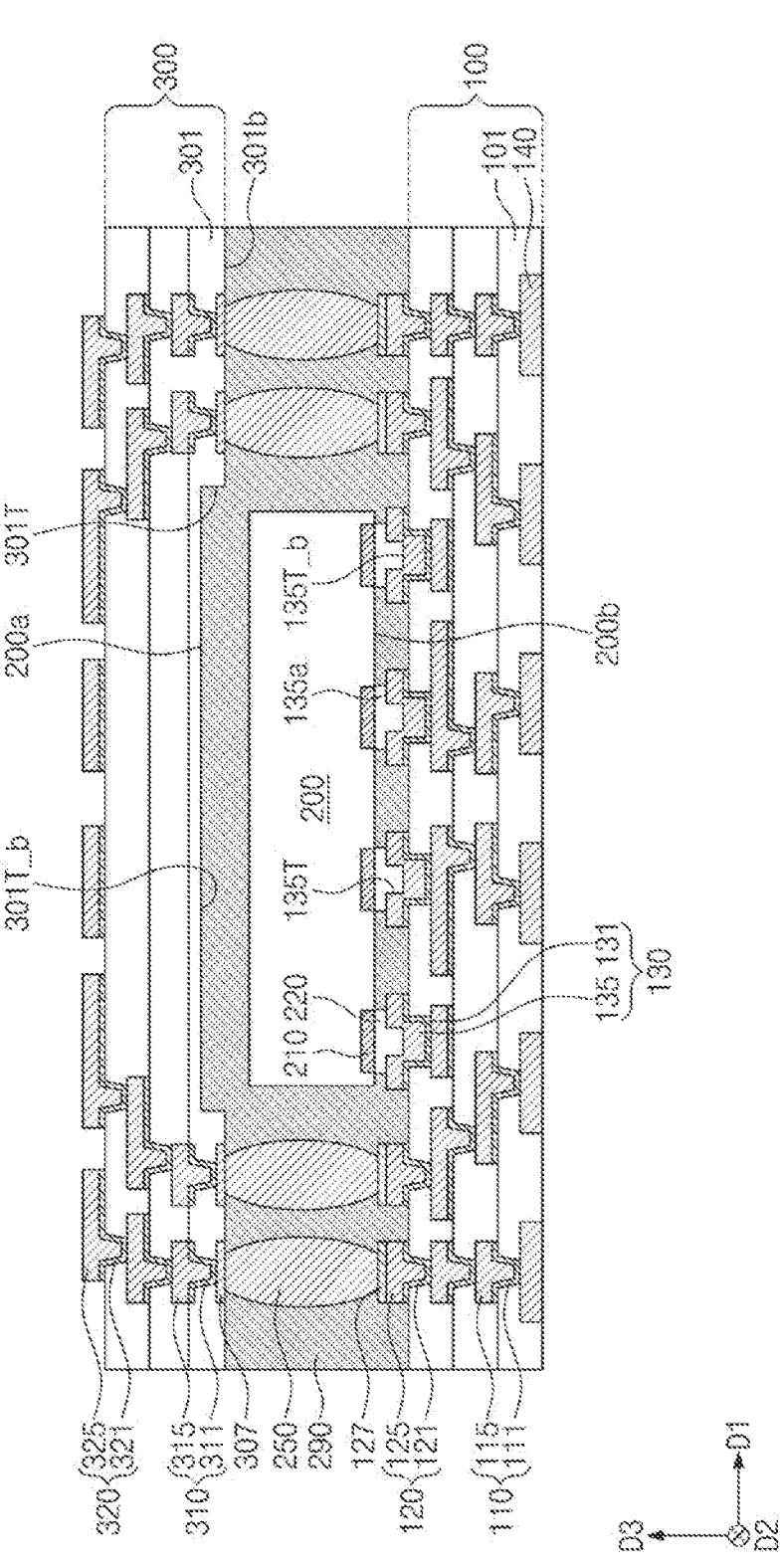

Referring to FIG. 12, the first package substrate 100 and the first semiconductor chip 200 formed in FIG. 7 may be assembled to the interposer 300 formed in FIG. 11. During assembly, the first conductive ball 250a and the second conductive ball 250b may come into contact with each other to form a vertical conductive structure 250. A first molding layer 290 may be filled between the first package substrate 100 and the interposer 300 in a lateral direction (a first direction D1 and/or a second direction D2). The first molding layer 290 may cover the upper surface of the first package substrate 100. The first molding layer 290 may cover the upper surface, sidewalls, and the lower surface 200b of the first semiconductor chip 200. The first molding layer 290 may cover the vertical conductive structures 250. The first molding layer 290 may be interposed between the first connection terminals 220 to cover the first connection terminals 220. The first molding layer 290 may fill the first recess region 301T.

Referring back to FIG. 2, a second connection terminal 530, a second package substrate 510, a second semiconductor chip 600, and a second molding layer 620 may be formed on the interposer 300. The second connection terminal 530 may vertically overlap the third pad structure 320. The second connection terminal 530 may vertically overlap the second package pads 515 of the second package substrate 510. The second chip pad 610 may be connected to the first package pad 513 by wire bonding 630. The second molding layer 620 may cover an upper surface and a side surface of the second semiconductor chip 600. The second molding layer 620 may cover a portion of the upper surface of the second package substrate 510. The second molding layer 620 may cover the wire bonding 630. Accordingly, the semiconductor package 1 may be formed.

Figure 13A:
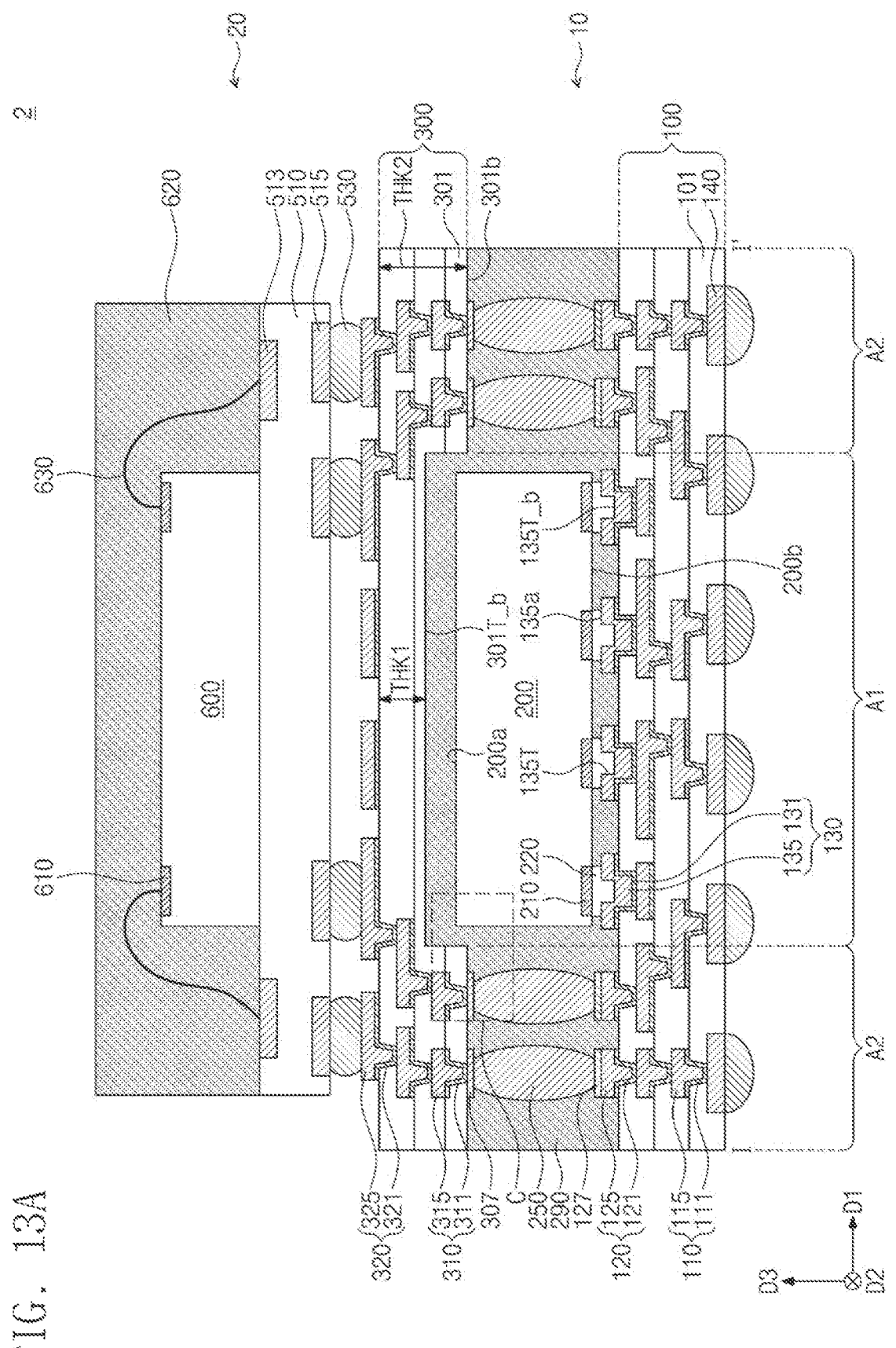
FIG. 13A is a cross-sectional view of a semiconductor package according to an example embodiment of the disclosure.

FIG. 13A is a cross-sectional view of a semiconductor package according to an example embodiment of the disclosure. FIG. 13B is a cross-sectional view of part "C" of FIG. 13A according to an example embodiment of the disclosure. A description overlapping the description with reference to FIGS. 1 to 3C will be omitted, except as described below.

Referring to FIGS. 13A and 13B, a semiconductor package 2 may include a first package 10, a second package 20 on the first package 10, and an interposer 300 therebetween.

The first package 10 may include a first package substrate 100, a first semiconductor chip 200, vertical conductive structures 250, and a first molding layer 290. The second package 20 may include a second semiconductor chip 600, a second package substrate 510, a second molding layer 620, and a wire bonding 630.

The interposer 300 may include a second recess 301T that vertically overlaps the first semiconductor chip 200. The second recess 301T may be a concave region in a third direction D3 of the interposer 300 or in a direction away from the first semiconductor chip 200. The second recess 301T may not completely penetrate a second insulating layer 301. In a plan view, the first semiconductor chip 200 may be disposed in the second recess 301T.

According to an example embodiment, a level of an upper surface 200a of the first semiconductor chip 200 may be higher in the third direction D3 than a level of the lower surface 301b of the interposer 300. Alternatively, the level of the upper surface 200a of the first semiconductor chip 200 may be substantially equal to the level of the lower surface 301*b* of the interposer 300. This may vary depending on characteristics of the semiconductor package 2 to be manufactured.

Figure 14:
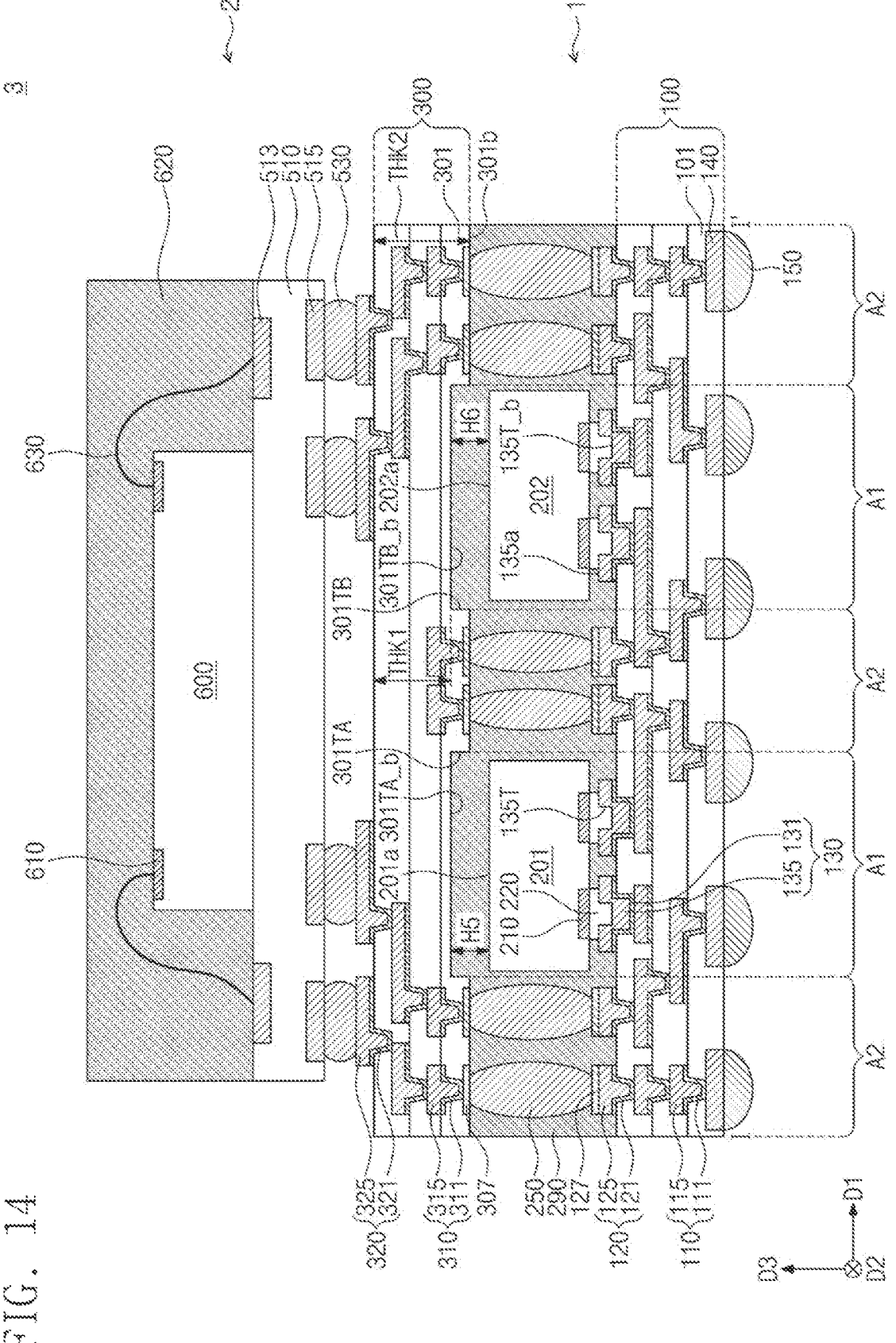
FIG. 14 is a cross-sectional view of a semiconductor package according to an example embodiment of the disclosure.

FIG. 14 is a cross-sectional view of a semiconductor package according to an example embodiment of the disclosure. A description overlapping the description with reference to FIGS. 1 to 3C will be omitted, except as described below.

Referring to FIG. 14, a semiconductor package 3 may include a first package 10 and a second package 20. The first package 10 may include a first package substrate 100, a third semiconductor chip 201, a fourth semiconductor chip 202, vertical conductive structures 250, a first molding layer 290, and an interposer 300.

The third semiconductor chip 201 and the fourth semiconductor chip 202 may be provided on the first package substrate 100. The third semiconductor chip 201 and the fourth semiconductor chip 202 may be horizontally spaced apart from each other. The third semiconductor chip 201 and the fourth semiconductor chip 202 may be, for example, a memory chip, a logic chip, or a sensing chip, but is not limited thereto.

The interposer 300 may include a third recess 301TA that vertically overlaps the third semiconductor chip 201. The interposer 300 may include a fourth recess 301TB that vertically overlaps the fourth semiconductor chip 202. The third recess 301TA and the fourth recess 301TB may be concave regions in the third direction D3 or in a direction away from the first semiconductor chip 200. The third and fourth recessed regions 301TA and 301TB may not completely penetrate the second insulating layer 301. In a plan view, the third semiconductor chip 201 may be disposed in the third recess area 301TA. In a plan view, the fourth semiconductor chip 202 may be disposed in the fourth recess region 301TB.

A distance in the third direction D3 from an upper surface 201*a* of the third semiconductor chip 201 to a lower surface 301TA_b of the interposer 300 defining the third recess 301TA may be a fifth height H5. The fifth height H5 may be about 40 μm to about 60 μm. A distance in the third direction D3 from the upper surface 202*a* of the fourth semiconductor chip 202 to a lower surface 301TB_b of the interposer 300 defining the fourth recess region 301TB may be a sixth height H6. The sixth height H6 may be about 40 μm to about 60 μm. For example, the fifth height H5 and the sixth height H6 may be substantially the same. Alternatively, the fifth height H5 and the sixth height H6 may be different from each other.

The first molding layer 290 may fill the third and fourth recess regions 301TA and 301TB. The first molding layer 290 may fill the second recess 301T. A level of an upper surface of the first molding layer 290 may be higher than a level of a lower surface 301*b* of the interposer 300.

The semiconductor package according to example embodiments may include the pad structure vertically overlapping the semiconductor chip on the package substrate, and the pad structure may include the first recess. Accordingly, the connection terminal interposed between the semiconductor chip and the pad structure may fill at least the portion of the first recess, thereby reducing the distance between the package substrate and the semiconductor chip. Accordingly, the thickness of the semiconductor chip may be increased while maintaining the overall thickness of the semiconductor package, and thus the heat dissipation characteristics of the semiconductor package may be improved.

In addition, the connection terminal may contact the inner wall of the pad structure defining the first recess, and thus the contact area between the pad structure and the connection terminal may increase. Accordingly, the electrical reliability of the semiconductor package may be improved.

Also, the interposer on the semiconductor chip may include the second recess that vertically overlaps the semiconductor chip. Accordingly, the thickness of only the semiconductor chip may be increased while maintaining the distance from the upper surface of the first semiconductor chip to the lower surface of the interposer defining the second recess. Accordingly, the heat dissipation characteristics of the semiconductor package may be improved.

Also, although the thickness of the semiconductor chip may be increased due to the second recess, the distance from the upper surface of the semiconductor chip to the lower surface of the interposer defining the second recess may be maintained. Accordingly, the molding layer may easily fill the space between the interposer and the first semiconductor chip, thereby preventing the void from being generated in the molding layer. Accordingly, the physical characteristics and insulating characteristics of the molding layer may be improved, and the reliability of the semiconductor package may be improved.

While example embodiments are described above, a person skilled in the art may understand that many modifications and variations are made without departing from the spirit and scope of the disclosure defined in the following claims. Accordingly, the example embodiments of the disclosure should be considered in all respects as illustrative and not restrictive, with the spirit and scope of the disclosure being indicated by the appended claims.

What is claimed is:

1. A semiconductor package comprising:
a first package substrate;
a first semiconductor chip on the first package substrate;
an interposer on the first semiconductor chip and comprising a first recess in a lower portion thereof, the first recess vertically overlapping the first semiconductor chip;
a vertical conductive structure on the first package substrate and a side surface of the first semiconductor chip, and connecting the first package substrate and the interposer; and
a first molding layer in the first recess, between the first semiconductor chip and the interposer, and between the first semiconductor chip and the first package substrate, wherein a lower surface of the interposer defining the first recess is higher than an upper surface of the vertical conductive structure.

2. The semiconductor package of claim 1, wherein the first semiconductor chip is provided in the first recess.

3. The semiconductor package of claim 1, wherein a maximum depth of the first recess is about 10 μm to about 15 μm.

4. The semiconductor package of claim 1, wherein a distance from an upper surface of the first semiconductor chip to the lower surface of the interposer defining the first recess is about 40 μm to about 60 μm.

5. The semiconductor package of claim 1, wherein the first molding layer covers the first semiconductor chip and the first package substrate, and fills the first recess, and
wherein an upper surface of the first molding layer is higher than the lower surface of the interposer.

6. The semiconductor package of claim 5, wherein the first molding layer comprises an epoxy-based molding compound.

7. The semiconductor package of claim 1, wherein an upper surface of the first semiconductor chip is higher than the lower surface of the interposer.

8. The semiconductor package of claim 1, wherein a thickness of the first semiconductor chip is about 110 μm to about 123 μm.

9. The semiconductor package of claim 1, wherein the vertical conductive structure comprises tin (Sn), silver (Ag), copper (Cu), or an alloy thereof.

10. The semiconductor package of claim 1, further comprising:

a second semiconductor chip provided on the interposer;

a second package substrate provided between the interposer and the second semiconductor chip, the second package substrate comprising a package pad in a lower portion of the second package substrate;

a second molding layer covering the second semiconductor chip and the second package substrate;

a pad structure provided on the interposer; and a connection terminal interposed between the pad structure and the package pad.

11. The semiconductor package of claim 1, further comprising a second semiconductor chip horizontally spaced apart from the first semiconductor chip, wherein the interposer comprises a second recess vertically overlapping the second semiconductor chip in the lower portion of the interposer, and wherein the lower surface of the interposer defining the second recess is higher than the upper surface of the vertical conductive structure.

12. A semiconductor package comprising:

a first package substrate;

a first semiconductor chip provided on the first package substrate;

an interposer provided on the first semiconductor chip;

a connection terminal provided between the first package substrate and the first semiconductor chip; and a vertical conductive structure provided on the first package substrate and a side surface of the first semiconductor chip, wherein the first package substrate comprises a first pad structure and a second pad structure that are provided in an upper portion of the first package substrate, wherein the first pad structure vertically overlaps the connection terminal, wherein the second pad structure vertically overlaps the vertical conductive structure, wherein the first pad structure comprises a recess, wherein the connection terminal fills at least a portion of the recess, and wherein a lower surface of the connection terminal is lower than a lower surface of the vertical conductive structure.

13. The semiconductor package of claim 12, wherein the first pad structure has a ring shape with a closed lower surface.

14. The semiconductor package of claim 12, wherein an upper surface of the first pad structure is higher than the lower surface of the connection terminal.

15. The semiconductor package of claim 12, wherein an upper surface of the first pad structure and an upper surface of the second pad structure are at a substantially same level.

16. The semiconductor package of claim 12, wherein the connection terminal contacts an inner wall of the first pad structure defining the recess.

17. The semiconductor package of claim 16, wherein a diameter of an inner perimeter of the first pad structure defining the recess is about 20 μm to about 40 μm.

18. A semiconductor package comprising:

a first package substrate comprising a pad structure provided in an upper portion of the first package substrate;

a first semiconductor chip provided on the pad structure;

vertical conductive structures provided on the first package substrate and on side surfaces of the first semiconductor chip;

a first molding layer covering the first semiconductor chip and an upper surface of the first package substrate;

an interposer provided on the first semiconductor chip and the vertical conductive structures;

a second package substrate provided on the interposer;

a second semiconductor chip provided on the second package substrate; and a second molding layer covering an upper surface of the second package substrate and the second semiconductor chip, wherein the interposer comprises:

a first part vertically overlapping the first semiconductor chip, and a second part surrounding the first part, and wherein a thickness of the first part is less than a thickness of the second part.

19. The semiconductor package of claim 18, wherein a difference between the thickness of the second part and the thickness of the first part is about 10 μm to about 15 μm.

20. The semiconductor package of claim 18, further comprising a connection terminal provided between the pad structure and the first semiconductor chip, wherein the pad structure comprises a recess, and wherein the connection terminal fills at least a portion of the recess, and contacts an inner wall of the pad structure defining the recess.

\* \* \* \* \*